United States Patent
Simizu

(10) Patent No.: US 6,545,282 B2
(45) Date of Patent: Apr. 8, 2003

(54) APPARATUS AND METHODS FOR REDUCING COULOMBIC BLUR IN CHARGED-PARTICLE-BEAM MICROLITHOGRAPHY

(75) Inventor: Hiroyasu Simizu, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/126,995

(22) Filed: Apr. 19, 2002

(65) Prior Publication Data

US 2002/0153494 A1 Oct. 24, 2002

(30) Foreign Application Priority Data

Apr. 19, 2001 (JP) .......................................... 2001-120537

(51) Int. Cl.$^7$ ................................................. G20K 5/10
(52) U.S. Cl. ............................... 250/492.22; 250/492.2; 250/398
(58) Field of Search .................... 250/492.22, 492.2, 250/398

(56) References Cited

U.S. PATENT DOCUMENTS 6,008,498 A   12/1999  Simizu
6,049,084 A   4/2000   Simizu
6,066,855 A   5/2000   Simizu
6,087,667 A   7/2000   Nakasuji et al.

OTHER PUBLICATIONS

U.S. patent application Ser. No. 09/843,592, Yamada et al., filed Apr. 26, 2001.

U.S. patent application Ser. No. 09/901,766, Simizu, filed Jul. 9, 2001.

Primary Examiner—Bruce Anderson
Assistant Examiner—James J Leybourne
(74) Attorney, Agent, or Firm—Klarquist Sparkman LLP

(57) ABSTRACT

Charged-particle-beam (CPB) microlithography apparatus and methods are disclosed that produce reduced blur resulting from the Coulomb effect, without having to reduce exposure current, exposure accuracy, or throughput. An exemplary apparatus is configured to expose regions ("exposure units" or "subfields") each having a maximal lateral dimension of at least 1 mm. The beam half-angle (half width at half maximum of the distribution of beam intensity) is 1 mrad or less.

7 Claims, 5 Drawing Sheets

APPARATUS AND METHODS FOR REDUCING COULOMBIC BLUR IN CHARGED-PARTICLE-BEAM MICROLITHOGRAPHY

FIELD

This disclosure pertains to microlithography (transfer of a fine pattern from a reticle to a substrate using an energy beam). Microlithography is a key technique used in the fabrication of microelectronic devices such as integrated circuits, displays, thin-film magnetic pickup heads, and micromachines. More specifically, the disclosure pertains to microlithography performed using a charged particle beam such as an electron beam or ion beam, and to controlling "Coulombic blur" (i.e., beam blur caused by the Coulomb effect) in apparatus and methods for performing charged-particle-beam microlithography.

BACKGROUND

A notable industrial trend continuing to this day is the progressive reduction in pattern linewidths of circuit elements of microelectronic devices, accompanying the progressively greater miniaturization and density of such devices as formed on semiconductor wafers and the like. Meanwhile, in processes for fabricating microelectronic devices, the linewidth-resolution limitations of optical microlithography have become increasingly apparent. These limitations provide ongoing motivation to the relevant industry to expend substantial effort in the development of a practical "next generation" microlithography technology that offers prospects of substantially greater linewidth resolution than obtainable using optical microlithography. One candidate microlithography technology currently under intensive development is microlithography performed using a charged particle beam (e.g., an electron beam). A principal objective in this development effort is a charged-particle-beam (CPB) microlithography system that can achieve the desired high pattern resolution without substantially sacrificing throughput (number of wafers that can be processed lithographically per unit time).

An overview of the projection-optical system of a conventional electron-beam microlithography system, configured for projecting the pattern of a "divided" or "segmented" reticle, is shown in FIG. 5. An electron "illumination beam" is emitted from an electron-beam source situated upstream of the depicted projection-optical system. The illumination beam passes through an upstream illumination-optical system (not shown), which shapes and directs the illumination beam to illuminate a selected portion of a pattern-defining reticle 1. As the illumination beam passes through the illuminated portion of the reticle 1, the beam acquires an aerial image of the illuminated portion of the pattern. Thus, the beam propagating downstream of the reticle 1 is termed a "patterned beam" 2. The patterned beam 2 passes through a projection-optical system comprising first and second projection lenses 3, 4. The projection-optical system resolves the aerial image on the upstream-facing surface of a wafer 5 or analogous substrate. So as to be imprinted with the image, the upstream-facing surface of the wafer 5 is coated with a suitable "resist." Note that the image formed on the wafer 5 is smaller than the corresponding illuminated region on the reticle 1, normally by an integer factor (e.g., ¼, by which is meant that the image is ¼ the size of the corresponding illuminated region on the reticle). This factor is termed the "demagnification ratio" of the projection-optical system.

As noted above, the reticle 1 is "segmented" or "divided" by which is meant that the pattern on the reticle is divided into small exposure units, usually termed "subfields," each defining a respective portion of the overall pattern. By way of example, each subfield conventionally is approximately 1 mm square in size. The subfields normally are arrayed in rows and columns on the reticle 1. By way of example, the width of a row of subfields is approximately 20 mm or other dimension representing the maximum distance over which the illumination beam can be deflected laterally (relative to the optical axis) for illumination of subfields. The subfields normally are illuminated sequentially subfield-by-subfield in each row, and row-by-row. This exposure sequence can be continuous (by continuous scanning) or intermittent (by step-and-repeat or step-and-scan). As each subfield is illuminated, the corresponding image, carried by the patterned beam 2, is formed on the surface of the wafer 5. By way of example, if the subfield size on the reticle 1 is 1 mm square, then (with a demagnification ratio of ¼) the size of the corresponding image as formed on the wafer surface is 0.25 mm square.

As the pattern is being illuminated subfield-by-subfield by the illumination beam, a deflector in the projection-optical system deflects the patterned beam 2 as required to form each subfield image at the appropriate location on the wafer surface. By forming the subfield images at the appropriate locations, the images are "stitched" together properly to form a contiguous pattern. At a demagnification ratio of ¼, the width of each row of subfields as projected on to the wafer from a 20-mm row on the reticle is approximately 5 mm.

In the conventional CPB microlithography system described above, whenever a large exposure current is used, the patterned beam exhibits a problematical "blur" that arises from the so-called "Coulomb" effect (mutual repulsion of like-charged particles in the beam). This "Coulombic blur" tends not to be uniform across the pattern as projected onto the wafer. Also, greater distortion is exhibited with greater degrees of lateral beam deflection. Coulombic blur results in degraded pattern resolution, critical-dimension (CD) uniformity, and overlay accuracy, as well as stitching errors from subfield to subfield. Conventional approaches to preventing or reducing Coulombic blur involve reducing the beam current used for making the exposure. However, an undesirable consequence of reducing the exposure current is a corresponding increase in the amount of time to expose each subfield. This causes a corresponding reduction in throughput.

SUMMARY

In view of the deficiencies of conventional methods and apparatus as summarized above, the present invention provides, inter alia, charged-particle-beam (CPB) microlithography methods and systems that produce and exhibit, respectively, reduced Coulombic blur. These benefits are achieved without having to reduce beam current for exposure and without having to sacrifice exposure accuracy and throughput.

To such ends and according to an aspect of the invention, microlithography apparatus are provided that comprise a CPB optical system situated and configured to transfer-expose a pattern, divided into multiple exposure units each defining a respective portion of the pattern, onto a substrate using a charged particle beam passing through the CPB optical system. The CPB optical system is configured to transfer-expose the exposure units such that each exposure unit as imaged on the substrate has a maximum lateral dimension of at least 1 mm. The CPB optical system also is configured to provide the charged particle beam with a beam half-angle on the substrate of no more than 1 mrad.

The "maximum lateral dimension" referred to above can be a length or width (whichever is greater) of a square or rectangular exposure unit as exposed on the wafer. Hence, in this instance, the maximum lateral dimension is the maximum length of a line connecting two corners of the outline of the exposure unit. The "exposure unit" is the unit of the pattern that is exposed in one shot. If the exposure unit is not square or rectangular, but rather is some other polygonal shape, then the "maximum lateral dimension" is the longest diameter of the polygon as exposed on the wafer.

In the microlithography apparatus summarized above the exposure units can have different mutually perpendicular lateral dimensions. I.e., these exposure units are rectangular, wherein the width is different than the length of each rectangle. By configuring the exposure units in this manner, the beam distribution is widened, with a corresponding reduction in the Coulomb effect. Also, with respect to a divided reticle, by making the width of each exposure unit (i.e., dimension in the lateral beam-deflection direction) greater than the length of the exposure unit, the required magnitude of beam deflection necessary to expose the exposure units is reduced, with a corresponding reduction in deflection aberrations.

The foregoing and additional features and advantages of the invention will be more readily apparent from the following detailed description, which proceeds with reference to the accompanying drawings.

DETAILED DESCRIPTION

General Considerations

Figure 3:
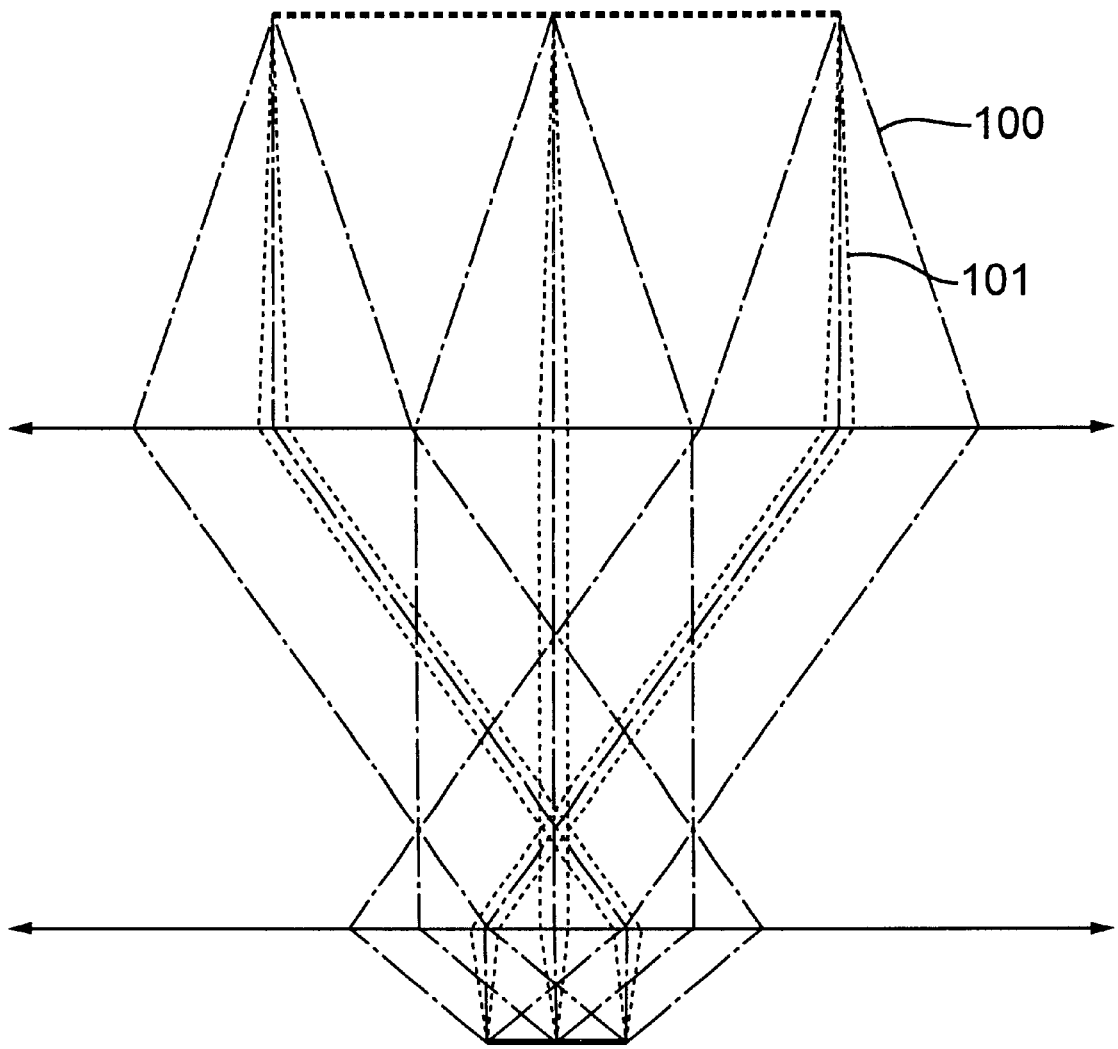
FIG. 3 is a schematic elevational diagram of respective beam-trajectory profiles produced by subfields having the same width but that are exposed under different respective beam half-angles. The beam half-angle in profile 101 is less than the beam half-angle in profile 100.

Coulombic blur (i.e., blur of the patterned beam at the image plane as caused by Coulomb effects in the beam) typically is expressed (see Equation (1), below) as being, at least approximately, inversely proportional to a power of the half-angle of the charged particle beam at the image plane. The beam half-angle is defined as the half width at half maximum of the transverse beam-intensity distribution at the image plane.

$$\text{Coulomb blur} = k \cdot I \cdot L / (\alpha \cdot V^{3/2}) \tag{1}$$

wherein k is a constant, I is beam current, L is the length of the "column" of the beam, $\alpha$ is the beam half-angle, and V is the beam-acceleration voltage. Based on Equation (1), Coulombic blur would be expected to become infinitely large as the beam half-angle is infinitely narrowed. In contrast to this conventional expectation, Applicant has discovered that, in the case of a CPB microlithography (transfer-exposure) apparatus, continued reduction of the beam half-angle does not result in the Coulombic blur approaching infinity. Rather, the magnitude of blur approaches a discrete value that is a function of image dimensions. For example, FIG. 3 depicts two exemplary CPB trajectories 100, 101 produced by two separate beams, having different respective half-angles, from a subfield having a particular fixed width. Specifically, the beam trajectory 100 is of a beam having a wide beam half-angle $\alpha$, and the beam trajectory 101 is of a beam having a narrow beam half-angle $\alpha$. The beam having the wider trajectory 100 exhibits less Coulomb effect than the beam having the narrower trajectory 101. Whenever the half-angle is reduced further relative to the half-angle in the narrower trajectory 101, no accompanying further significant change occurs in the overall width of the trajectory. Consequently, no further significant change in the Coulomb effect occurs with such further reduction in beam half-angle.

Figure 4:
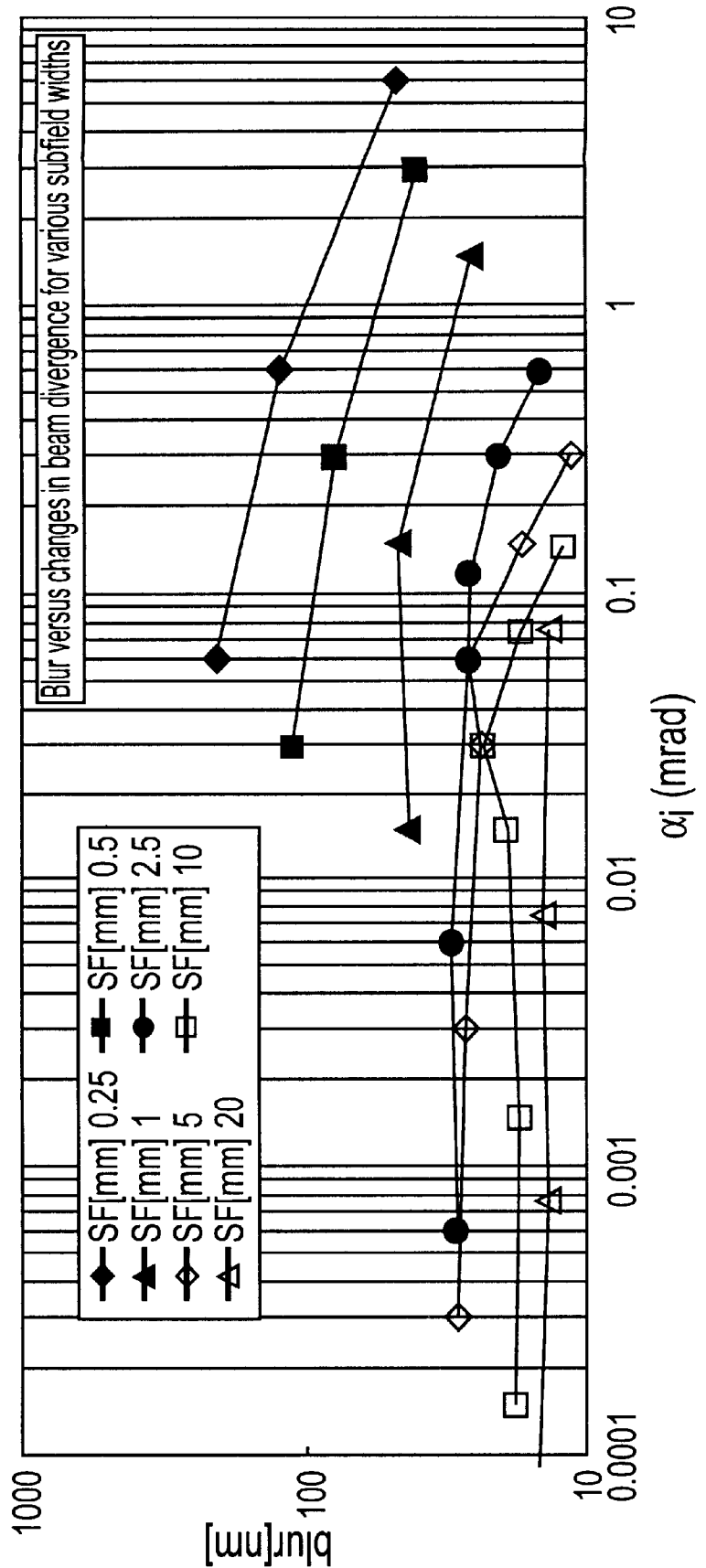
FIG. 4 includes plots of Coulombic blur produced by subfields of various denoted widths, as functions of beam half-angle. Other applicable conditions include a beam-acceleration voltage of 100 kV, an exposure current of 10 $\mu$A, and a projection-system column length of 400 mm.
Figure 5:
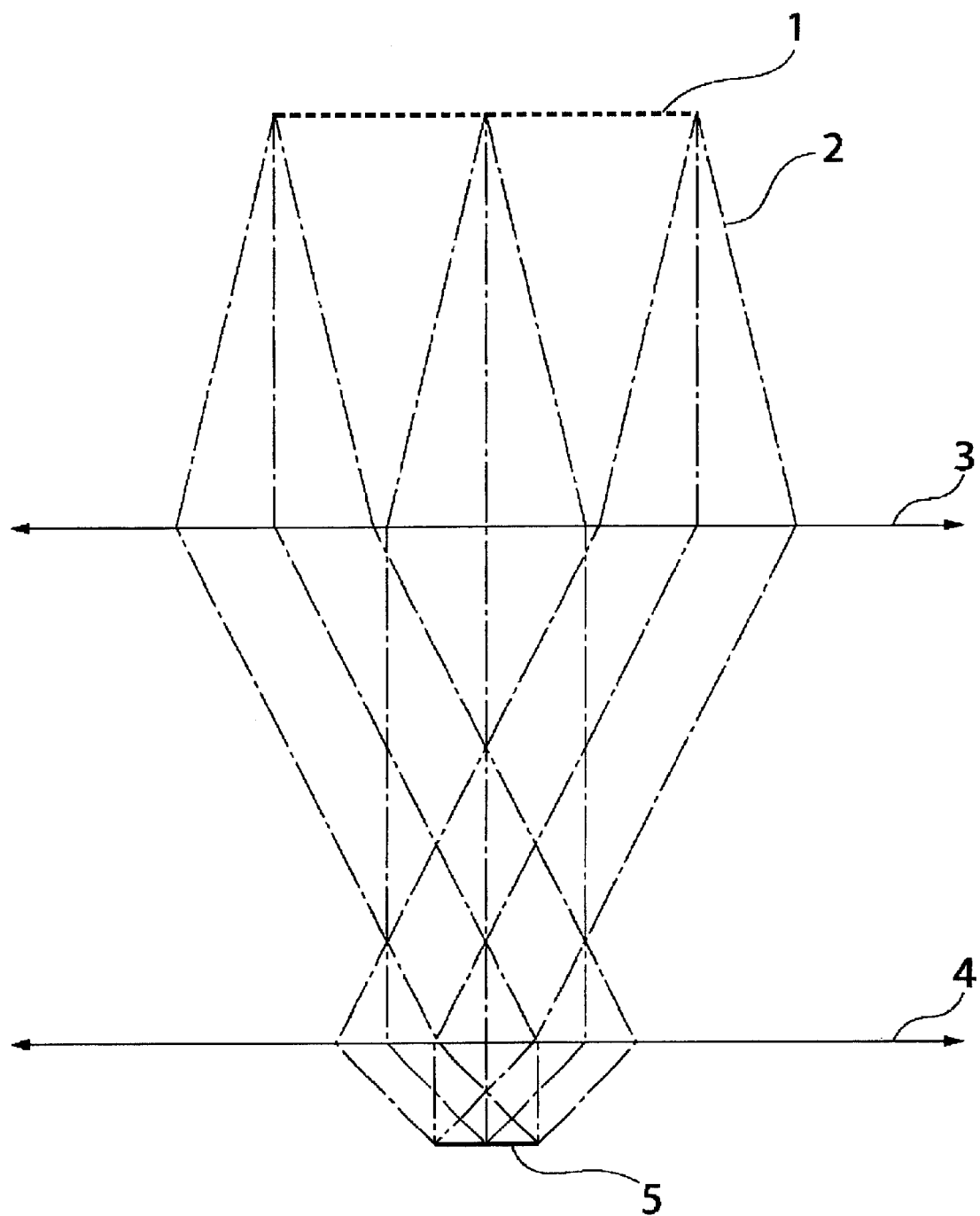
FIG. 5 is a schematic elevational diagram of beam trajectories produced by a projection-optical system of a conventional divided-reticle CPB transfer-exposure system.

FIG. 4 shows respective results of calculations of Coulombic blur as a function of beam half-angle $\alpha$ for various subfield widths. Prevailing conditions are a beam-acceleration voltage of 100 kV, an exposure current of 10 $\mu$A, and a column length (of the projection-optical system) of 400 mm. The abscissa ($\alpha_i$, in mrad) is the beam half-angle of the various patterned beams at the image plane, and the ordinate is corresponding Coulombic blur (in nm). In the figure the various "SF" values are respective dimensions of one side of the respective square subfield as projected onto the wafer. For example, "SF [mm]0.25" denotes a subfield that is 0.25 mm square on the wafer.

In a situation directed at resolving a pattern element having a minimum linewidth of 70 nm, it is necessary for Coulombic blur exhibited by the CPB microlithography apparatus to be 50 nm or less. In FIG. 4, it can be seen that the magnitude of Coulombic blur depends upon image dimensions (e.g., upon the width of the exposure unit). Note that both abscissa and ordinate are logarithmic scales. For example, Coulombic blur is relatively large whenever the image dimensions are approximately 0.25 mm square at the image plane. In the stated example, and referring to FIG. 4, the required blur specification ($\leq$50 nm) is not satisfied for an image dimension of 0.25 mm square unless the beam half-angle is at least 2 mrad. Alternatively, the blur specification could be met by reducing the beam current. Increasing the beam half-angle (while keeping the same image dimensions of 0.25 mm square) requires that the "emittance" (estimated by the product of the beam half-angle and the image dimensions) of the electron gun (or other CPB source) be increased. Whenever the beam half-angle is increased in this manner (i.e., by increasing source emittance), illumination uniformity is difficult to establish and maintain. Consequently, the beam half-angle is not increased easily in this manner.

On the other hand, FIG. 4 shows that, if subfield dimensions are increased to 1 mm square or more, Coulombic blur can be placed within the required specification even with a beam half-angle of 1 mrad or less. I.e., the magnitude of Coulombic blur can be maintained at 50 nm or less. Hence, while not having to change emittance, the magnitude of Coulombic blur can be maintained within specifications by reducing the beam half-angle and correspondingly increasing the size of the exposure units. Reducing Coulombic blur in this manner does not reduce throughput. Also, since Coulombic blur tends to approach a respective limit in this manner, rather than continuing to increase, it is possible to reduce the emittance of the CPB source by an amount by which the beam half-angle can be decreased without changing subfield size. This allows the illumination-uniformity specifications to be relaxed.

Whenever the beam half-angle is changed while maintaining a constant emittance, aberrations are predominantly spherical aberration and axial chromatic aberration at larger beam half-angles and predominantly field-curvature aberration at smaller beam half-angles.

Whenever emittance is reduced to $\frac{1}{10}$ with no change in beam half-angle, image dimensions are reduced accordingly. Under such conditions, field curvature is reduced by $(\frac{1}{10})^2 \frac{1}{100}$. However, Coulombic blur is increased approximately 10-fold by making such a change. Total blur can be minimized by combining these effects in a manner providing both a low emittance and a narrow beam half-angle. Coulombic blur is controlled by using a CPB-optical system capable of accommodating large exposure units, small beam half-angles, and low emittances (e.g., the beam half-angle is 1 mrad or less whenever the maximum lateral dimension of an exposure unit is 1 mm or more). This "maximum lateral dimension" can be a length or width (whichever is greater) of a square or rectangular exposure unit as exposed on the wafer. If the exposure unit is not square or rectangular, but rather is some other polygonal shape, then the "maximum lateral dimension" is the longest diameter of the polygon as exposed on the wafer.

Whenever the beam half-angle is narrowed while holding the emittance constant, image dimensions are increased, with a corresponding increase in distortion and rotation magnification chromatic aberration. However, if an SMD ("symmetric magnetic doublet") projection-lens system is used, the projection lens (and any deflectors associated therewith) can be optimized in a manner that (at least theoretically) results in substantial elimination of these aberrations. In contrast, spherical aberration, coma aberration, and axial chromatic aberration (for which no effective correction methods are known) can be reduced effectively to zero by reducing the beam half-angle. Hence, by combining these effects, mutual cancellations are established that make it possible to provide an optical system that generates substantially no aberration.

Exemplary Embodiment

Figure 1:
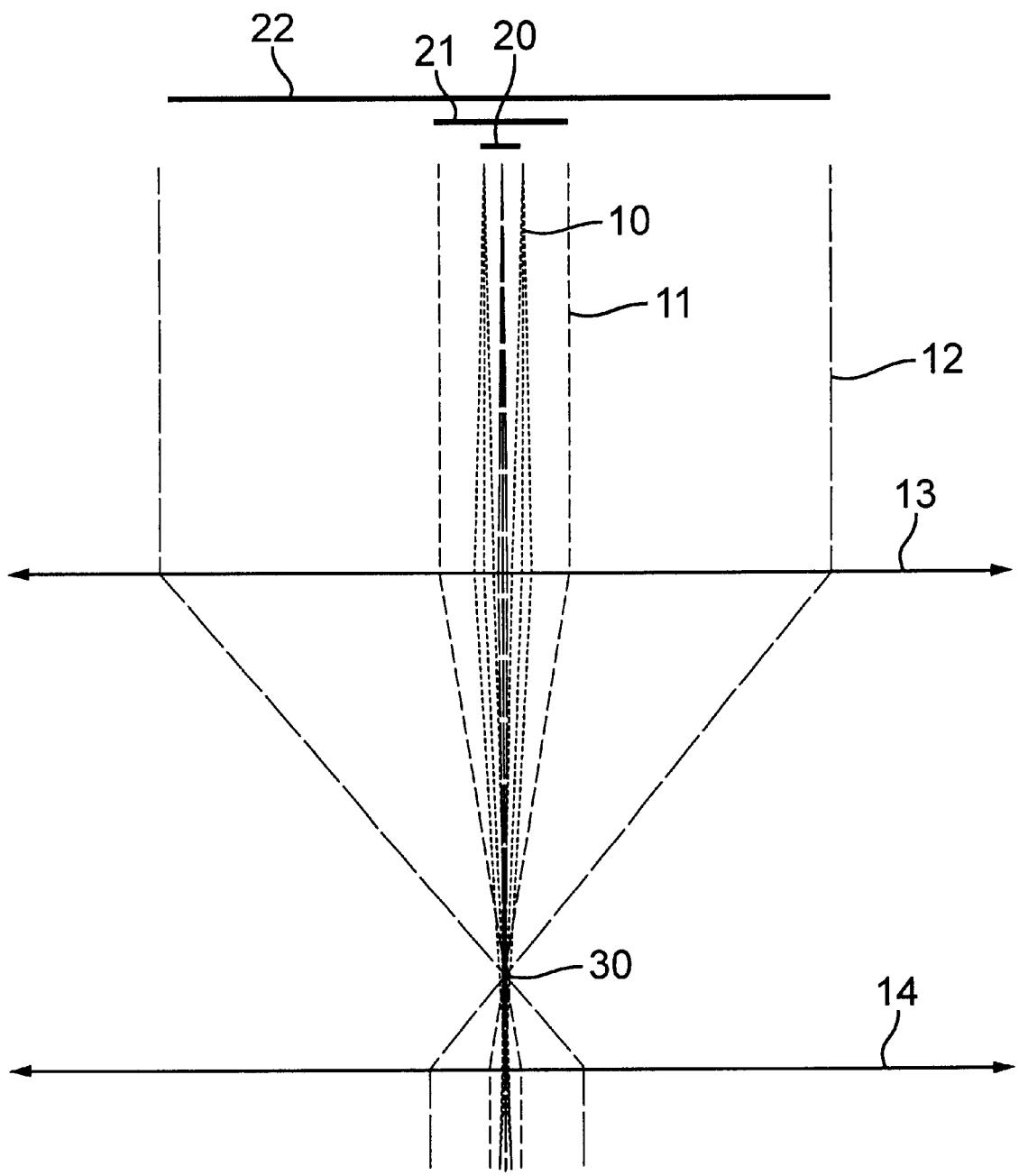
FIG. 1 is a schematic elevational diagram of exemplary beam-trajectory profiles of a charged-particle patterned beam through a projection-optical system of a CPB transfer-exposure apparatus according to a representative embodiment, wherein the profiles are determined by the width of the region on the reticle that is exposed in one shot (i.e., the width of the exposure unit).

An exemplary embodiment is shown in FIG. 1, depicting exemplary beam trajectories exhibited by a projection-optical system of a CPB transfer-exposure apparatus according to the embodiment. In FIG. 1, for comparison purposes, the trajectory 10 is of a conventional patterned beam propagating from a conventionally sized subfield 20 (e.g., 1 mm square) on the reticle. The trajectory 11 is of a patterned beam, according to this embodiment, propagating from a subfield 21 substantially wider than the subfield 20 (with a corresponding reduction in the beam half-angle). The trajectory 12 is of a patterned beam, according to the embodiment, propagating from a subfield 22 that has been further widened (with a corresponding reduction in beam half-angle) relative to the subfield 21. The relative widths of the subfields 20, 21, 22 are shown at the top of the figure. Items 13 and 14 are first and second projection lenses, respectively, of the projection-optical system.

The maximum lateral dimensions of the subfields 21, 22 are established with due consideration of the magnitude of respective aberrations and by the brightness of the CPB source (e.g., electron gun) situated upstream of the subfields 20, 21, 22. As indicated in FIG. 1, beam trajectories widen substantially other than at the crossover point 30. Increasing the width of the trajectories 11, 12 greatly reduces the Coulomb effect.

Figure 2A:
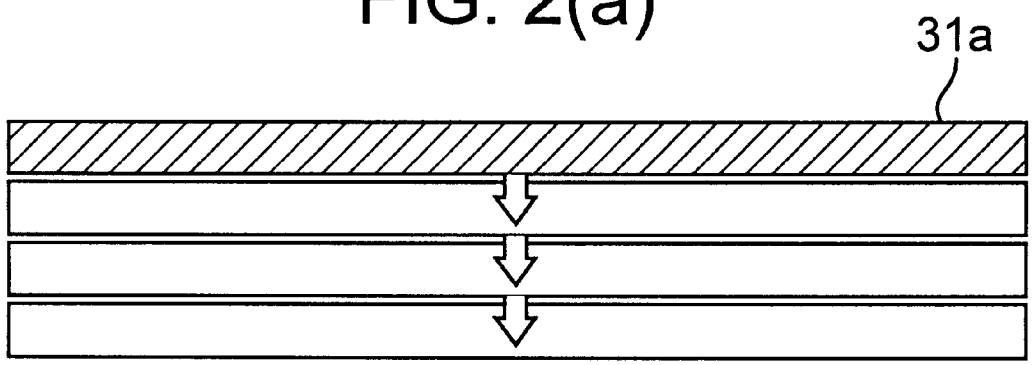
FIGS. 2(a)–2(c) are schematic plan views of exemplary subfields and of their respective exposure sequences, according to the representative embodiment. The subfield width is greatest in FIG. 2(a), least in FIG. 2(c), and intermediate in FIG. 2(b).
Figure 2B:
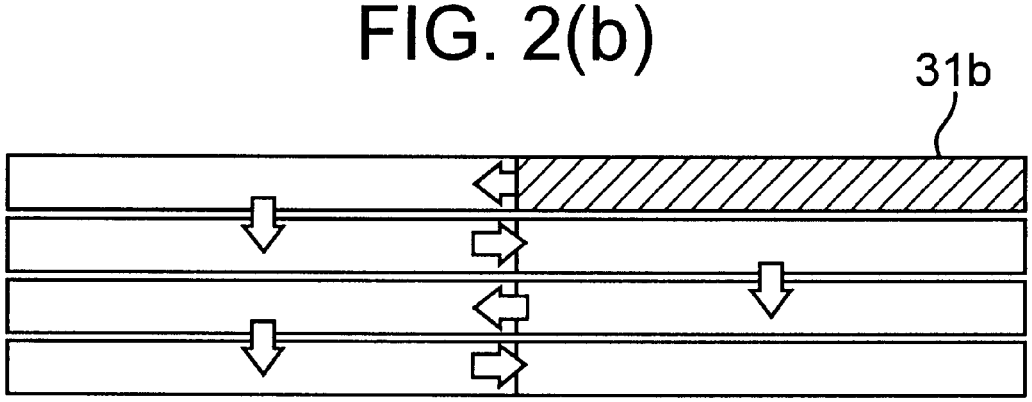
Figure 2C:
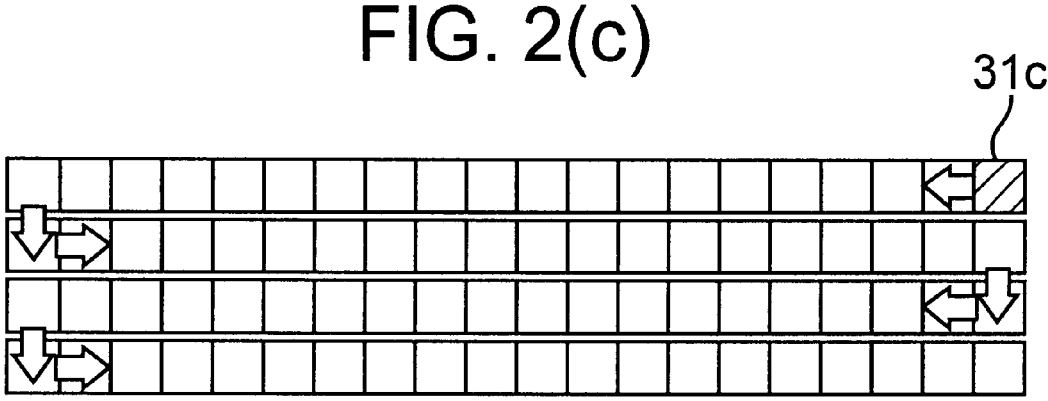

FIGS. 2(a)–2(c) depict exemplary exposure sequences and corresponding exposure-unit widths used in FIG. 1. For example, in FIG. 2(c), a conventional configuration of the respective subfields 31c and a conventional exposure sequence for the subfields are shown for comparison purposes. FIG. 2(b) depicts an instance in which each subfield 31b has a width dimension that is half the width of the main field of the projection-optical system. FIG. 2(a) depicts an instance in which each subfield 31a has a width equal to the width of the main field. In FIGS. 2(b) and 2(c), the rectangular configuration of the subfields has certain advantages. First, comparing square subfields with rectangular subfields having the same area as the square subfields, rectangular subfields can produce less Coulombic blur since the distances between charged particles of the beam are decreased compared to the square subfields. Second, the rectangular subfields require less beam deflection than the square subfields. Third, rectangular subfields generally produce a stiffer reticle than the square subfields.

Further with respect to FIGS. 2(a)–2(c), the respective subfields 31a–31c are exposed in respective exposure sequences, starting from the respective "dark" (first) subfield. In the conventional case (FIG. 2(c)) although the subfields 31c are small, the deflection range on the wafer is relatively large, approximately ±5 mm. As a result, deflection aberrations are prevalent. In the situation shown in FIG. 2(b), each subfield 31b is half the width of the main field. As a result, the deflection range is nearly half the deflection range in the conventional case, with a corresponding reduction in deflection aberrations. In the situation shown in FIG. 2(a), each subfield 31a has a width equal to the width of the main field. As a result, the need for lateral deflections of the beam is eliminated substantially, allowing a further reduction in deflection aberrations. The situations shown in FIGS. 2(b) and 2(c) also allow the power rating of deflectors in the illumination-optical and projection-optical systems of the CPB microlithography system to be reduced substantially.

Thus, it is possible to reduce Coulombic blur without having to reduce exposure beam current, while simultaneously providing accurate exposure of fine patterns with good throughput. Even if exposure is performed at a higher beam current than conventionally, resolution, critical-dimension (CD) uniformity, interconnection fidelity, and interlayer-stacking accuracy are not compromised. Also, throughput is not compromised. It also is possible to use a CPB source exhibiting reduced emittance than conventionally, thereby reducing costs. Also, because the lateral deflection ranges of the illumination beam and patterned beam are reduced compared to conventional systems, deflection aberrations are reduced.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A microlithography apparatus, comprising a charged-particle-beam (CPB) optical system situated and configured to transfer-expose a pattern, divided into multiple exposure units each defining a respective portion of the pattern, onto a substrate using a charged particle beam passing through the CPB optical system, the CPB optical system being configured to transfer-expose the exposure units such that each exposure unit as imaged on the substrate has a maximum lateral dimension of at least 1 mm, and to provide the charged particle beam with a beam half-angle on the substrate of no more than 1 mrad.

2. The microlithography apparatus of claim 1, wherein the exposure units have different mutually perpendicular lateral dimensions.

3. A charged-particle-beam (CPB) optical system for transfer-exposing a pattern, divided into multiple exposure units on the reticle wherein each exposure unit defines a respective portion of the pattern, onto a substrate using a charged particle beam, the CPB optical system being configured to produce, on the substrate, an image of each exposure unit having a maximum lateral dimension of at least 1 mm, and the charged particle beam having a beam half-angle on the substrate of no more than 1 mrad.

4. A charged-particle-beam (CPB) optical system for transfer-exposing a pattern, divided into multiple exposure units on the reticle wherein each exposure unit defines a respective portion of the pattern, onto a substrate using a charged particle beam, the CPB optical system comprising:

imaging means for producing, on the substrate, an image of each exposure unit, the image having a maximum lateral dimension of at least 1 mm; and beam half-angle-controlling means for configuring the charged particle beam, as incident on the substrate, with a beam half-angle of no more than 1 mrad.

5. In a charged-particle-beam microlithography method, a method for reducing Coulombic blur of an image formed on a substrate by a charged particle beam passing through a charged-particle-beam (CPB) optical system, the method comprising:

providing a pattern, as defined on a reticle, divided into multiple exposure units on the reticle, each exposure unit defining a respective portion of the pattern, each exposure unit being dimensioned to produce, when exposed onto the substrate, an image having a maximum lateral dimension of at least 1 mm;

configuring a charged particle beam, used for transfer-exposing the exposure unit to the substrate, with a beam half-angle of no more than 1 mrad; and passing the charged particle beam, propagating from the exposure unit on the reticle, through the CPB optical system to the substrate.

6. The method of claim 5, wherein the exposure units are dimensioned to have different mutually perpendicular lateral dimensions.

7. The method of claim 6, wherein the lateral dimension is greater in a lateral beam-deflection direction of the CPB optical system.

* * * * *

UNITED STATES PATENT AND TRADEMARK OFFICE
CERTIFICATE OF CORRECTION

PATENT NO.    : 6,545,282 B2
DATED         : April 8, 2003
INVENTOR(S)   : Hiroyasu Simizu It is certified that error appears in the above-identified patent and that said Letters Patent is hereby corrected as shown below:

Column 3,
Line 9, "comers" should be -- corners --.

Column 5,
Lines 22-23, $(^1/_{10})\ ^{21}/_{100}$" should be -- $(^1/_{10})^2 = ^1/_{100}$ --.

Signed and Sealed this

Eleventh Day of November, 2003

JAMES E. ROGAN
*Director of the United States Patent and Trademark Office*